United States Patent [19]

Oyama et al.

[11] 4,417,297
[45] Nov. 22, 1983

[54] PRINTED CIRCUIT BOARD

[75] Inventors: Kohei Oyama; Hiroyuki Yokouchi, both of Soma, Japan

[73] Assignee: Alps Electric Co., Ltd., Tokyo, Japan

[21] Appl. No.: 279,687

[22] Filed: Jul. 2, 1981

[30] Foreign Application Priority Data

Jul. 8, 1980 [JP] Japan .............................. 55-95812[U]

[51] Int. Cl.³ ............................................. H05K 1/14
[52] U.S. Cl. ................................. 361/412; 174/138 G; 361/414
[58] Field of Search ....................... 361/412, 414; 174/138 D, 138 E, 138 G

[56] References Cited

U.S. PATENT DOCUMENTS

| | | | |
|---|---|---|---|
| 2,937,358 | 5/1960 | Bulger | 361/414 X |
| 3,250,848 | 5/1966 | Beelitz et al. | 361/414 X |
| 3,446,908 | 5/1969 | Tally et al. | 361/412 X |
| 3,566,005 | 2/1971 | Shaheen | 174/68.5 |
| 4,100,368 | 7/1978 | Thomsen | 361/412 X |

OTHER PUBLICATIONS

Bivar Inc., Dissopad Catalog, 1969, Printed by Bivar Inc., Santa Ana, California, pp. 1 to 3.

*Primary Examiner*—R. R. Kucia
*Attorney, Agent, or Firm*—Guy W. Shoup; Gerard F. Dunne

[57] ABSTRACT

In a printed circuit board wherein chip components are mounted in aligned holes provided through two printed substrates stacked over one another, spacer members are interposed between the printed substrates so as to define spaces therebetween around the holes. Since the printed substrates and chip components are movable relative one another due to such spaces, thermal stresses in the joints between the chip components and the printed substrates can be relieved.

6 Claims, 6 Drawing Figures

PRINTED CIRCUIT BOARD

BACKGROUND OF THE INVENTION

The present invention relates to printed circuit boards, and more particularly, to a printed circuit board formed from two printed substrates.

A prior art printed circuit board is as shown in FIG. 1. A printed substrate 1 has conductive foils 1b and 1b formed on both surfaces of a single insulating substrate 1a made of a paper epoxy resin substrate or glass epoxy resin substrate. The substrate 1a is provided with a hole 2 therethrough, and a chip component 3 such as a chip capacitor is inserted through the hole 2. Electrode portions 3a and 3a at ends of the chip component 3 are soldered to the conductive foils 1b and 1b, as shown by numeral 4.

Another type of circuit board is shown in FIG. 2, wherein printed substrates 1 and 1 each having a conductive foil 1b formed on the outer surface of insulating substrate portion 1a are placed one over the other, and bonded to each other by a binder 5 made of a thermosetting resin. A chip component 3 is inserted into aligned holes 2 provided in both substrate portions 1a and 1a. Electrode portions 3a and 3a of the chip component 3 are soldered at 4 to the conductive foils 1b and 1b.

In general, the chip component 3 is constructed as shown in FIG. 3. A rod-like or cylindrical insulating body 3b is made of a ceramic material, and its surface has a film 3c of a resistor material or the like formed thereover. The electrode portions 3a and 3a are disposed at both ends of the insulating body 3b. An insulating coating 3d is formed so as to cover the film 3c which is located between the electrodes 3a and 3a.

When such chip component 3 is inserted in the hole or holes 2 of the printed substrate or substrates 1 and soldered to the conductive foils 1b as illustrated in FIGS. 1 or 2, the insulating body 3b of the chip component 3 and the insulating substrate 1a of each printed substrate 1 may expand due to thermal effects. After the soldering, they may each shrink due to cooling. Further, when an electric equipment having such a printed circuit board is operated, the insulating body 3b and the insulating substrate portion 1a may repeatedly expand and contract with the rise and fall of the temperature within the electric equipment. The insulating body 3b of a ceramic material and the insulating substrate portion 1a of the paper epoxy resin substrate or the like typically have unequal coefficients of thermal expansion, and the differential thickness of the insulating substrate portion 1a between the expanded and contacted states thereof is several times greater than that of the insulating body 3b in the direction of the hole 2. For this reason, a stress acts on the soldered joint between the chip component 3 and the printed substrate 1. The stresses produced by the expansion and contraction of the printed substrate 1 may damage the conductive foil 1b and the electrode portion 3a or cause the conductive foil 1b or the electrode portion 3a to separate from the soldered joint 4. Such known circuit boards therefore have the disadvantage that the chip componet 3 cannot be connected reliably to circuit patterns on the board.

SUMMARY OF THE INVENTION

An object of the present invention is to eliminate the disadvantage of such known circuit boards by providing a printed circuit board in which a chip component can be connected to conductive patterns reliably over a long term.

According to one aspect of performance of the present invention, there is provided a printed circuit board for mounting chip components comprising first and second printed substrates which are provided with conductive wiring patterns and which are formed with holes for receiving the chip components therein. Printed substrates are stacked and coupled together with spacer members therebetween. The chip components can then be inserted in set holes and soldered to said conductive patterns of said first and second printed substrates.

PREFERRED EMBODIMENTS OF THE INVENTION

Figure 1:
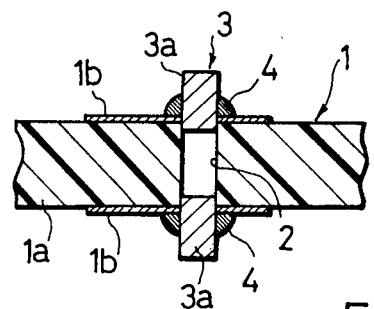
FIGS. 1 and 2 are fragmentary sectional views of known printed circuit boards.
Figure 2:
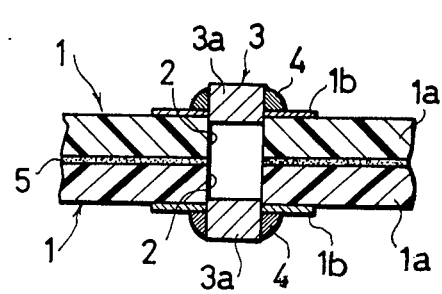
Figure 3:
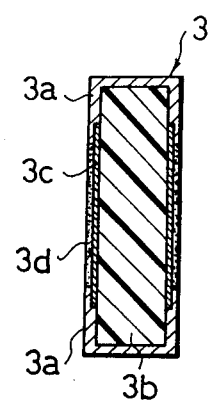
FIG. 3 is a sectional view of a chip component.
Figure 4:
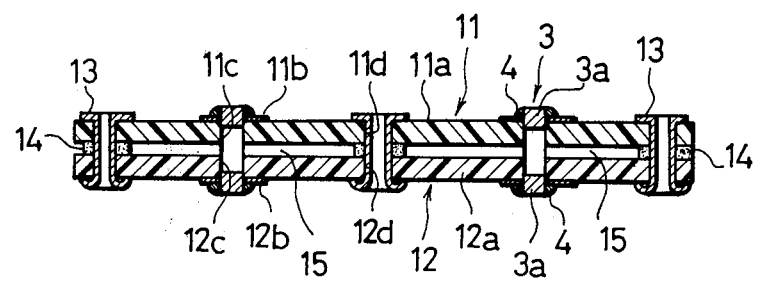
FIG. 4 is a sectional view of a printed circuit board according to the present invention.
Figure 5:
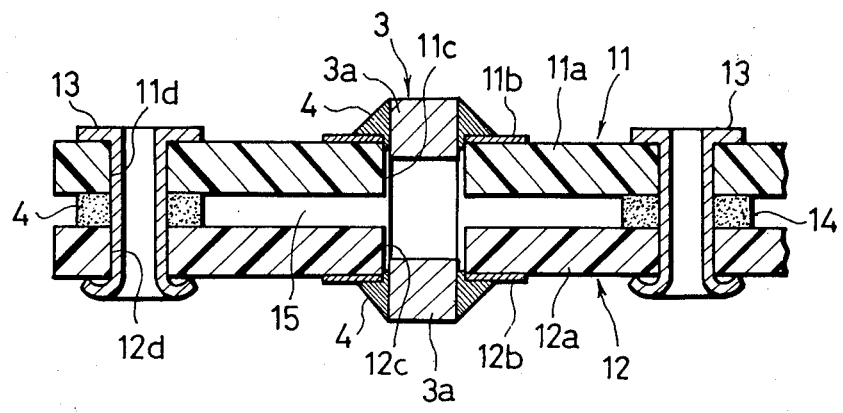
FIG. 5 is an enlarged fragmentary sectional view of the printed circuit board shown in FIG. 4.

An embodiment of the present invention is shown in FIGS. 4 and 5. Referring to the figures, numerals 11 and 12 designate first and second printed substrates in which conductive foils or similar conductive wiring patterns 11b and 12b are formed on the outer surfaces of insulating substrate portions 11a and 12a made of paper epoxy resin, glass epoxy resin, or the like. The first and second printed substrates 11 and 12 are respectively formed with holes 11c and 12c for receiving chip components 3 therein, and fitting holes 11d and 12d for receiving coupling members 13 therein. The coupling members 13 for coupling the first and second printed substrates 11 and 12 together are made of eyelets or the like members. Spacer members 14 each of which is made of a polyester film or the like having a thickness of, for example, 0.1 mm to 0.5 mm or so are placed between the two substrates 11 and 12 and extend around respective coupling members.

In assembling the printed circuit boards, the coupling members 13 are first inserted through respective fitting holes 11d of the first printed substrate 11 with the conductive patterns 11b facing outwardly. Subsequently, respective spacer members 14 are fitted on inserted coupling members 13 and the coupling members 13 are then fitted into the respective fitting holes 12d of the second printed substrate 12 with conductive patterns 12b facing outwardly.

Next, the lower ends of the coupling members 13 are caulked to couple the first and second printed substrates 11 and 12. Under the coupled state, the holes 11c and 12c respectively provided in the first and second printed substrates 11 and 12 are aligned, and a small space 15 is provided between the first and second printed substrates 11 and 12 in the vicinity of the holes 11c and 12c.

Thereafter, the chip components 3 are inserted through the holes 11c and 12c of the first and second printed substrates 11 and 12, and their electrode portions 3a and 3a are respectively soldered to the conductive patterns 11b and 12b as shown at numeral 4. Thereafter, the printed circuit board is completed.

With the printed circuit board thus constructed, even when the insulating substrate portions 11a and 12a and the insulating body 3b of the chip component 3 have respectively expanded or contracted under thermal stresses during the soldering or with temperature rise and fall inside the electric equipment, they can move relative one another in the direction of the thickness of the insulated substrate portions 11a and 12a owing to the presence of the spaces 15 between the first and second printed substrates 11 and 12, and hence, the stresses in the joints between the chip component 3 and the printed substrates 11 and 12 can be relieved.

That is, according the the present invention, the first and second printed substrates 11 and 12 are stacked and coupled through spacer members 14, and the spaces 15 defined between the first and second printed substrates 11 and 12 around the holes 11c and 12c for the chip components 3 enable relative movement between the chip component and the printed substrates 11 and 12. Therefore, even when the printed substrates 11 and 12 have expanded or contracted in the direction of the thickness thereof, they are displaceable owing to the spaces 15, and the stresses in the joints can be relieved. Accordingly, damage of the conductive patterns 11b and 12b of the printed substrates 11 and 12 or the electrode portions 3a of the chip components 3, and the separation between the conductive patterns 11b and 12b and the soldering part 4, or between the electrode portion 3a and the soldering part 4, can be reduced. The chip components 3 can thus be connected reliably over a long term to the circuit boards.

Figure 6:
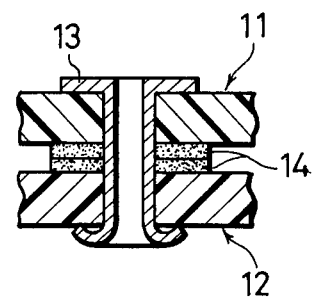
FIG. 6 is a fragmentary sectional view showing another embodiment of the present invention.

Although, in the above embodiment, the spacer member 14 had been described as the polyester film, it is a matter of course that a flat member made of any other material may well be employed. Alternatively, the spacer member 14 may be formed as shown in FIG. 6. In this embodiment, at least one of the opposing surfaces of the first and second printed substrates 11 and 12 is printed or coated with a resin such as solder resist or is formed with a copper foil (conductive foil) by the print-wiring technique to form the spacer member.

What is claimed is:

1. A printed circuit board for mounting chip components, comprising first and second printed substrates stacked over one another and each having conductive wiring patterns formed on the surfaces thereof facing outwardly, said first and second printed substrates having aligned holes extending between respective conductive wiring patterns of each said substrate and receiving therein respective chip components, said chip components having a coefficient of thermal expansion different than that of said first and second printed substrates and being soldered to said wiring patterns, and means including spacer members located between said first and second printed substrates for providing a spacing between said first and second printed substrates around said holes so that thermal stresses developed between said printed substrates and any of said chip components can be relieved by relative movement between said printed substrates to vary said spacing.

2. A printed circuit board for mounting chip components as defined in claim 1, further comprising coupling members extending through aligned openings in said first and second printed substrates, said coupling members having said spacer members fitted therearound so as to hold said printed substrates in a spaced manner.

3. A printed circuit board for mounting chip components as defined in claim 1, said spacer members being formed from a polyester film.

4. A printed circuit board for mounting chip components as defined in claim 1, said spacer members being provided by a layer selected from the group consisting of a resin and a copper foil deposited on at least one of opposing surfaces of said printed substrates, said layer being deposited at areas of said printed substrates remote from any of said holes receiving a chip component so that portions of said printed substrates adjacent said chip components are free to deflect relative thereto to relieve thermal stresses.

5. A printed circuit board for mounting chip components as defined in claim 3, said polyester film being located at areas of said printed substrate remote from any of said holes receiving a chip component so that portions of said printed substrate adjacent said chip components are free to deflect relative thereto to relieve thermal stresses.

6. A printed circuit board for mounting chip components, comprising first and second printed substrates stacked one over another and each having conductive wiring patterns formed on the surfaces thereof facing outwardly, said first and second printed substrates having aligned holes extending between respective conductive wiring patterns of each said substrate and receiving therein respective chip components, said chip components having a coefficient of thermal expansion different than that of the first and second printed substrates and being soldered to said wiring patterns, and means including spacer members located between said first and second printed substrates at locations remote from any of said holes receiving a chip component for providing a spacing between said first and second printed substrates around said holes so that thermal stresses developed between said printed substrates and any of said chip components can be relieved by deflection of portions of said printed substrates adjacent said chip components.

* * * * *